(12) United States Patent
Kyung et al.

(10) Patent No.: US 7,302,629 B2
(45) Date of Patent: Nov. 27, 2007

(54) APPARATUS AND METHOD FOR CODING AND DECODING IRREGULAR REPEAT ACCUMULATE CODES

(75) Inventors: Gyu-Bum Kyung, Seoul (KR); Hong-Sil Jeong, Incheon (KR); Jae-Yoel Kim, Gunpo-si (KR)

(73) Assignee: Samsung Electronics Co., Ltd. (KR)

( * ) Notice: Subject to any disclaimer, the term of this patent is extended or adjusted under 35 U.S.C. 154(b) by 524 days.

(21) Appl. No.: 11/009,231

(22) Filed: Dec. 10, 2004

(65) Prior Publication Data

US 2005/0132260 A1 Jun. 16, 2005

(30) Foreign Application Priority Data

Dec. 10, 2003 (KR) .................. 10-2003-0089719

(51) Int. Cl.
*H03M 13/29* (2006.01)
*H03M 13/45* (2006.01)

(52) U.S. Cl. .................. 714/752; 714/755; 714/780

(58) Field of Classification Search .............. 714/752, 714/755, 780
See application file for complete search history.

(56) References Cited

U.S. PATENT DOCUMENTS

| | | | |
|---|---|---|---|
| 7,013,116 B2* | 3/2006 | Ashikhmin et al. ......... 455/214 |
| 2005/0050435 A1* | 3/2005 | Kyung et al. ............... 714/800 |
| 2005/0111564 A1* | 5/2005 | Kramer et al. .............. 375/265 |

OTHER PUBLICATIONS

Li, et al., "Generalized Product Accumulate Codes: Analysis and Performance", GLOBECOM 2001, Nov. 2001, pp. 975-979.*
Echard, et al., "The Pi-Rotation Low-Density Parity Check Codes", GLOBECOM 2001, Nov. 2001, pp. 980-984.*
Echard, et al., "Deterministic Pi-Rotation Low-Density Parity Check Codes", Electronics Letters, May 2002, vol. 38, No. 10, pp. 464-465.*
Echard, et al., "The Extended Irregular Pi-Rotation LDPC Codes", IEEE Communications Letters, vol. 7, No. 5, May 2003, pp. 230-232.*
ten Brink, et al., "Design of Repeat-Accumulate Codes for Iterative Detection and Decoding", IEEE Transactions on Signal Processing, vol. 31, No. 11, Nov. 2003, 2764-2772.*

* cited by examiner

*Primary Examiner*—Stephen M. Baker
(74) *Attorney, Agent, or Firm*—The Farrell Law Firm

(57) ABSTRACT

An apparatus and method for coding an irregular Repeat Accumulate (RA) code. A repeater repeats a received information word such that the information word corresponds to weights of a first information part and a second information part of a parity check matrix in which permutation matrixes are arranged in the first information part and the second information part corresponding to the information word such that a minimum length of a cycle on a factor graph of the irregular RA code becomes a predetermined length and weights are irregular, and a dual diagonal matrix is arranged in a parity part corresponding to a parity. An interleaver interleaves a signal output from the repeater using an interleaving scheme predefined for the parity check matrix. An accumulator generates the irregular RA code by accumulating a signal output from the interleaver according to a weight of the parity part.

17 Claims, 9 Drawing Sheets

$$H = \begin{bmatrix} 1 & 0 & 1 & 0 & 1 & 0 & 1 & 0 \\ 1 & 0 & 0 & 1 & 0 & 1 & 0 & 1 \\ 0 & 1 & 1 & 0 & 0 & 1 & 1 & 0 \\ 0 & 1 & 0 & 1 & 1 & 0 & 0 & 1 \end{bmatrix}$$

| 600 | 602 | 604 |

| $p^a{}_{11}$ | $p^a{}_{12}$ | $p^b{}_{11}$ | $p^b{}_{12}$ | $p^b{}_{13}$ | |
|---|---|---|---|---|---|
| | | $p^b{}_{21}$ | $p^b{}_{22}$ | $p^b{}_{23}$ | |
| | | $p^b{}_{31}$ | $p^b{}_{32}$ | $p^b{}_{33}$ | |
| $p^a{}_{21}$ | $p^a{}_{22}$ | $p^b{}_{41}$ | $p^b{}_{42}$ | $p^b{}_{43}$ | |
| | | $p^b{}_{51}$ | $p^b{}_{52}$ | $p^b{}_{53}$ | |
| | | $p^b{}_{61}$ | $p^b{}_{62}$ | $p^b{}_{63}$ | |
| $p^a{}_{31}$ | $p^a{}_{32}$ | $p^b{}_{71}$ | $p^b{}_{72}$ | $p^b{}_{73}$ | |
| | | $p^b{}_{81}$ | $p^b{}_{82}$ | $p^b{}_{83}$ | |
| | | $p^b{}_{91}$ | $p^b{}_{92}$ | $p^b{}_{93}$ | |

FIG.6

APPARATUS AND METHOD FOR CODING AND DECODING IRREGULAR REPEAT ACCUMULATE CODES

PRIORITY

This application claims priority under 35 U.S.C. § 119 to an application entitled "Apparatus and Method for Coding/Decoding Irregular Repeat Accumulate Codes" filed in the Korean Intellectual Property Office on Dec. 10, 2003 and assigned Serial No. 2003-89719, the contents of which are incorporated herein by reference.

BACKGROUND OF THE INVENTION

1. Field of the Invention

The present invention relates generally to an apparatus and method for coding/decoding, and in particular, to an apparatus and method for coding/decoding Repeat Accumulate (RA) codes.

2. Description of the Related Art

In communication operations, it is very important to efficiently and reliably transmit data over a channel. In the next generation multimedia mobile communication systems, i.e., systems into which active research is currently being made, it is necessary to increase system efficiency using a channel coding scheme that is appropriate for the system because there is a large demand for a high-speed communication system capable of processing and transmitting a variety of information such as image and radio data, beyond the capabilities of early voice-oriented services.

During data transmission, inevitable errors caused by noise, interference, and fading occur according to channel conditions, often resulting in a loss of information. Accordingly, in order to reduce the information loss, various error-control schemes have been used according to characteristics of channels to increase system reliability. The most typical error-control scheme uses error-correcting codes.

FIG. 1 is a block diagram illustrating a transceiver of a conventional communication system. Referring to FIG. 1, in a transmitter side, a transmission message 'u' is coded by an encoder 101 using a predetermined coding scheme, before being transmitted over a channel. The symbol 'c' coded by the encoder 101 is modulated by a modulator 103 using a predetermined modulation scheme, and the modulated signal 's' is transmitted to a receiver side over a channel 105.

A signal 'r' is received at the receiver side. The received signal 'r' is a distorted signal that is a mixture of the signal 's' transmitted by the transmitter side and various noises caused by a change in channel conditions of channel 105. The received signal 'r' is demodulated by a demodulator 107 using a demodulation scheme corresponding to the modulation scheme used in the modulator 103 of the transmitter side, and the demodulated signal 'x' is decoded by a decoder 109 using a decoding scheme corresponding to the coding scheme used in the encoder 101 of the transmitter side. Thereafter, the decoder 109 outputs the decoded signal û.

In order to enable the receiver side to decode the signal 'u' transmitted by the transmitter side without error, it is necessary to provide channel encoder and decoder having better performance. In particular, when the channel 105 is a wireless channel, errors caused by the channel 105 are more considerable. The decoder 109 of the transmitter side detects an estimated value of the transmission message using the data received over the channel 105.

Additionally, with the rapid progress of mobile communication systems, scheme for transmitting a large volume of data at and up to a capacity level presently available in wired networks must be developed for a wireless network. As a high-speed, high-capacity communication system capable of processing and transmitting various information such as image data and radio data as well as simple voice service data is required, it is necessary to increase the system transmission efficiency using an appropriate channel coding scheme in order to improve the system performance. However, as indicated above, a mobile communication system inevitably experiences errors occurring due to noise, interference, and fading according to channel conditions during data transmission. The occurrence of errors causes a loss of information data.

In order to reduce the information data loss due to the occurrence of errors, it is possible to improve reliability of the mobile communication system using various error-control schemes. As described above, the most commonly used error-control scheme uses an error-correcting code. A description will now be made of a turbo code and a low-density parity check (LDPC) code, which are typical error correcting codes.

A. Turbo Code

It is well known that the turbo code is superior in performance gain to a convolutional code conventionally used for error correction, during high-speed data transmission. The turbo code is advantageous in that it can efficiently correct an error caused by noises generated in a transmission channel, thereby increasing the reliability of the data transmission.

B. LDPC Code

The LDPC code can be decoded using an iterative decoding algorithm based on a sum-product algorithm on a factor graph. Because a decoder for the LDPC code uses the sum-product algorithm-based iterative decoding algorithm, it is lower in complexity to a decoder for the turbo code. In addition, the decoder for the LDPC code is easy to implement with a parallel processing decoder, as compared with the decoder for the turbo code.

Shannon's channel coding theorem shows that reliable communication is possible only at a data rate not exceeding a channel capacity. However, Shannon's channel coding theorem has proposed no detailed channel coding/decoding method for supporting a data rate up to the maximum channel capacity limit. Generally, although a random code having a very large block size shows performance approximating a channel capacity limit of Shannon's channel coding theorem, when a MAP (Maximum A Posteriori) or ML (Maximum Likelihood) decoding method is used, it is actually impossible to implement the decoding method because of its heavy calculation load.

The turbo code was proposed by Berrou, Glavieux, and Thitimajshima in 1993, and has superior performance approximating a channel capacity limit of Shannon's channel coding theorem. The proposal of the turbo code triggered active research on iterative decoding and graphical expression of codes. Similarly, LDPC codes proposed by Gallager in 1962 have been newly spotlighted in the research. Cycles exist on a factor graph of the turbo code and the LDPC code, and it is well known that iterative decoding on the factor graph of the LDPC code where cycles exist is suboptimal.

Also, it has been experimentally proven that the LDPC code has excellent performance through iterative decoding. The LDPC code known to have the highest performance ever shows performance having a difference of only about 0.04 [dB] at a channel capacity limit of Shannon's channel coding theorem at a bit error rate (BER) $10^{-5}$, using a block size $10^7$. In addition, although an LDPC code defined in Galois Field (GF) with q>2, i.e., GF(q), increases in complexity in its decoding process, it is far superior in performance to a binary code. However, no satisfactory theoretical description of successful decoding by an iterative decoding algorithm for the LDPC code defined in GF(q) has yet been provided.

More specifically, the LDPC code, proposed by Gallager, is defined by a parity check matrix in which major elements have a value of 0 and minor elements except the elements having the value of 0 have a non-zero value, i.e., a value of 1. For example, an (N, j, k) LDPC code is a linear block code having a block length N, and is defined by a sparse parity check matrix in which each column has j elements having a value of 1, each row has k elements having a value of 1, and all of the elements except for the elements having the value of 1 have a value of 0.

An LDPC code in which a weight of each column in the parity check matrix is fixed to 'j' and a weight of each row in the parity check matrix is fixed to 'k' as stated above, is called a "regular LDPC code." Herein, the "weight" refers to the number of elements having a non-zero value among the elements constituting the generating matrix and parity check matrix.

Unlike the regular LDPC code, an LDPC code in which the weight of each column in the parity check matrix and the weight of each row in the parity check matrix are not fixed is called an "irregular LDPC code." It is generally known that the irregular LDPC code is superior in performance to the regular LDPC code. However, in the irregular LDPC code, because the weight of each column and the weight of each row in the parity check matrix are not fixed, i.e., are irregular, the weight of each column in the parity check matrix and the weight of each row in the parity check matrix must be properly adjusted in order to guarantee the superior performance.

FIG. 2 illustrates a parity check matrix of an (8, 2, 4) LDPC code, e.g., an (N, j, k) LDPC code. More specifically, FIG. 2 is a diagram illustrating a parity check matrix of a general (8, 2, 4) LDPC code.

Referring to FIG. 2, a parity check matrix H of the (8, 2, 4) LDPC code is comprised of 8 columns and 4 rows, wherein a weight of each column is fixed to 2 and a weight of each row is fixed to 4. Because the weight of each column and the weight of each row in the parity check matrix are regular as stated above, the (8, 2, 4) LDPC code illustrated in FIG. 2 becomes a regular LDPC code.

FIG. 3 is a diagram illustrating a factor graph of the (8, 2, 4) LDPC code illustrated in FIG. 2. Referring to FIG. 3, a factor graph of the (8, 2, 4) LDPC code is comprised of 8 variable nodes of $x_1$ 300, $x_2$ 302, $x_3$ 304, $x_4$ 306, $x_5$ 308, $x_6$ 310, $x_7$ 312, and $x_8$ 314, and 4 check nodes 316, 318, 320, and 322. When an element having a value of 1, i.e., a non-zero value, exists at a point where an $i^{th}$ row and a $j^{th}$ column of the parity check matrix of the (8, 2, 4) LDPC code cross each other, a branch is created between a variable node $x_i$ and a $j^{th}$ check node.

Because the parity check matrix of the LDPC code has a very small weight as described above, it is possible to perform decoding through iterative decoding even in a block code having a relatively long length, that exhibits performance approximating a capacity limit of a Shannon channel, such as a turbo code, while continuously increasing a block length of the block code. MacKay and Neal have proven that an iterative decoding process of an LDPC code using a flooding transfer scheme is approximate to an iterative decoding process of a turbo code in performance.

However, in order to generate a high-performance LDPC code, the following conditions should be satisfied.

(1) Cycles on a Factor Graph of an LDPC Code should be Considered.

The term "cycle" refers to a loop formed by the edges connecting the variable nodes to the check nodes in a factor graph of an LDPC code, and a length of the cycle is defined as the number of edges constituting the loop. A cycle being long in length indicates that the number of edges connecting the variable nodes to the check nodes constituting the loop in the factor graph of the LDPC code is large. In contrast, a cycle being short in length indicates that the number of edges connecting the variable nodes to the check nodes constituting the loop in the factor graph of the LDPC code is small.

As cycles in the factor graph of the LDPC code become longer, the performance efficiency of the LDPC code increases. That is, when long cycles are generated in the factor graph of the LDPC code, it is possible to prevent performance degradation such as an error floor occurring when too many cycles with a short length exist on the factor graph of the LDPC code.

(2) Efficient Coding of an LDPC Code should be Considered.

It is difficult for the LDPC code to undergo real-time coding compared with a convolutional code or a turbo code because of its high coding complexity. In order to reduce the coding complexity of the LDPC code, a Repeat Accumulate (RA) code has been proposed. However, the RA code also has a limitation in reducing the coding complexity of the LDPC code. Therefore, efficient coding of the LDPC code should be considered.

(3) Degree Distribution on a Factor Graph of an LDPC Code should be Considered.

Generally, an irregular LDPC code is superior in performance to a regular LDPC code, because a factor graph of the irregular LDPC code has various degrees. The term "degree" refers to the number of edges connected to the variable nodes and the check nodes in the factor graph of the LDPC code. Further, the phrase "degree distribution" on a factor graph of an LDPC code refers to a ratio of the number of nodes having a particular degree to the total number of nodes. It has been proved by Richardson that an LDPC code having a particular degree distribution is superior in performance.

As described above, it is well known that the LDPC code, together with the turbo code, are superior in a performance gain for high-speed data transmission, and the LDPC code is advantageous in that it can efficiently correct errors caused by noises generated in a transmission channel, thereby increasing the reliability of the data transmission.

However, the LDPC code is not free in terms of coding rate. That is, because the LDPC code has a relatively high coding rate, it has limitation in terms of coding rate. In the current LDPC codes, most have a coding rate of ½ and only some have a coding rate of ⅓. The limitation in coding rate exerts a fatal influence on high-speed, high-capacity data transmission. Of course, although a degree distribution representing the best performance can be calculated using a density evolution scheme in order to implement a relatively low coding rate for the LDPC code, it is difficult to implement an LDPC code having a degree distribution representing the best performance due to various restrictions, such as a cycle structure on a factor graph and hardware implementation. In addition, the LDPC code makes it difficult to enable real-time coding and causes a delay in a decoding process.

SUMMARY OF THE INVENTION

It is, therefore, an object of the present invention to provide an apparatus and method for coding and decoding Repeat Accumulate (RA) codes that can undergo real-time coding.

It is another object of the present invention to provide an apparatus and method for coding and decoding RA codes having minimized decoding complexity.

It is further another object of the present invention to provide an apparatus and method for coding and decoding RA codes that can undergo real-time decoding.

In accordance with a first aspect of the present invention, there is provided an apparatus for coding an irregular Repeat Accumulate (RA) code. The apparatus includes a repeater for repeating a received information word such that the information word corresponds to weights of a first information part and a second information part of a parity check matrix in which permutation matrixes are arranged in the first information part and the second information part mapped to the information word such that a minimum length of a cycle on a factor graph of the irregular RA code becomes a predetermined length and weights are irregular, and a dual diagonal matrix is arranged in a parity part mapped to a parity; an interleaver for interleaving a signal output from the repeater using an interleaving scheme predefined for the parity check matrix; and an accumulator for generating the irregular RA code by accumulating a signal output from the interleaver according to a weight of the parity part.

In accordance with a second aspect of the present invention, there is provided an apparatus for decoding an irregular Repeat Accumulate (RA) code. The apparatus includes a variable node decoder for detecting, under the control of a controller, probability values of a received signal by connecting variable nodes according to a weight of each of columns constituting a parity check matrix in which permutation matrixes are arranged in a first information part and a second information part mapped to an information word such that a minimum length of a cycle on a factor graph of the irregular RA code becomes a predetermined length and weights are irregular, and a dual diagonal matrix is arranged in a parity part mapped to a parity; a first adder for subtracting a signal generated in a previous decoding process from an output signal of the variable node decoder; a deinterleaver for deinterleaving an output signal of the first adder using a deinterleaving scheme predefined for the parity check matrix; a check node decoder for detecting, under the control of the controller, probability values of an output signal of the deinterleaver by connecting check nodes according to a weight of each of rows constituting the parity check matrix; a second adder for subtracting an output signal of the deinterleaver from an output signal of the check node decoder; an interleaver for interleaving an output signal of the second adder using an interleaving scheme predefined for the parity check matrix, and outputting the interleaved signal to the variable node decoder and the first adder; and the controller for generating the parity check matrix, and controlling the deinterleaving scheme and the interleaving scheme according to the parity check matrix.

In accordance with a third aspect of the present invention, there is provided a method for generating a parity check matrix of an irregular Repeat Accumulate (RA) code. The method includes the steps of: determining a size of the parity check matrix of the irregular RA code such that the size corresponds to a coding rate and a codeword length, both of which are applied when coding an information word with the irregular RA code; dividing the parity check matrix with the determined size into a first information part and a second information part, both of which are mapped to the information word, and a parity part mapped to a parity; arranging permutation matrixes in the first information part and the second information part such that a minimum length of a cycle on a factor graph of the irregular RA code becomes a predetermined length and weights are irregular; and generating the parity check matrix by arranging a dual diagonal matrix in the parity part.

In accordance with a fourth aspect of the present invention, there is provided a method for coding an irregular Repeat Accumulate (RA) code. The method includes the steps of: receiving an information word; repeating the information word such that the information word corresponds to weights of a first information part and a second information part of a parity check matrix in which permutation matrixes are arranged in the first information part and the second information part mapped to the information word such that a minimum length of a cycle on a factor graph of the irregular RA code becomes a predetermined length and weights are irregular, and a dual diagonal matrix is arranged in a parity part mapped to a parity; interleaving the repeated signal using an interleaving scheme predefined for the parity check matrix; and generating the irregular RA code by accumulating the interleaved signal according to a weight of the parity part.

In accordance with a fifth aspect of the present invention, there is provided a method for decoding an irregular Repeat Accumulate (RA) code. The method includes the steps of: generating a parity check matrix in which permutation matrixes are arranged in a first information part and a second information part mapped to an information word such that a minimum length of a cycle on a factor graph of the irregular RA code becomes a predetermined length and weights are irregular, and a dual diagonal matrix is arranged in a parity part mapped to a parity; determining a deinterleaving scheme and an interleaving scheme for the parity check matrix; detecting probability values of a received signal; generating a first signal by subtracting a signal generated in a previous decoding process from the probability values of the received signal; deinterleaving the first signal using the deinterleaving scheme; detecting probability values from the deinterleaved signal; generating a second signal by subtracting the deinterleaved signal from the probability values of the deinterleaved signal; interleaving the second signal using the interleaving scheme; and iterative-decoding the interleaved signal.

BRIEF DESCRIPTION OF THE DRAWINGS

The above and other objects, features, and advantages of the present invention will become more apparent from the following detailed description when taken in conjunction with the accompanying drawings in which:

FIG. 6 is a diagram illustrating a parity check matrix of an irregular RA code according to an embodiment of the present invention;

DETAILED DESCRIPTION OF THE PREFERRED EMBODIMENT

Preferred embodiments of the present invention will now be described in detail with reference to the annexed drawings. In the following description, a detailed description of known functions and configurations incorporated herein has been omitted for conciseness.

The present invention proposes an apparatus and method for coding and decoding high-performance irregular Repeat Accumulate (RA) codes, i.e., a type of Low-Density Parity Check (LDPC) codes, which are error-correcting codes. That is, the present invention proposes an apparatus and method for coding and decoding irregular RA codes that can undergo real-time coding/decoding and have minimized decoding complexity.

As described above, one of the LDPC code's disadvantages is the high complexity of its encoder. In order to reduce complexity of the LDPC encoder, Richardson and Urbanke have proposed LDPC codes having an efficient coding scheme. However, the LDPC coding scheme proposed by Richardson and Urbanke also has a limitation in reducing the encoder complexity. Therefore, the present invention proposes an apparatus and method for coding and decoding irregular RA codes having excellent performance by applying iterative decoding on a factor graph like the LDPC codes.

The RA codes, i.e., a type of serial concatenated turbo codes, proposed by Divsalar et al. in 1998, can undergo linear real-time coding like the turbo codes and show excellent performance approximating a channel capacity limit of Shannon with simple calculation like the LDPC codes.

Figures 1, 2:
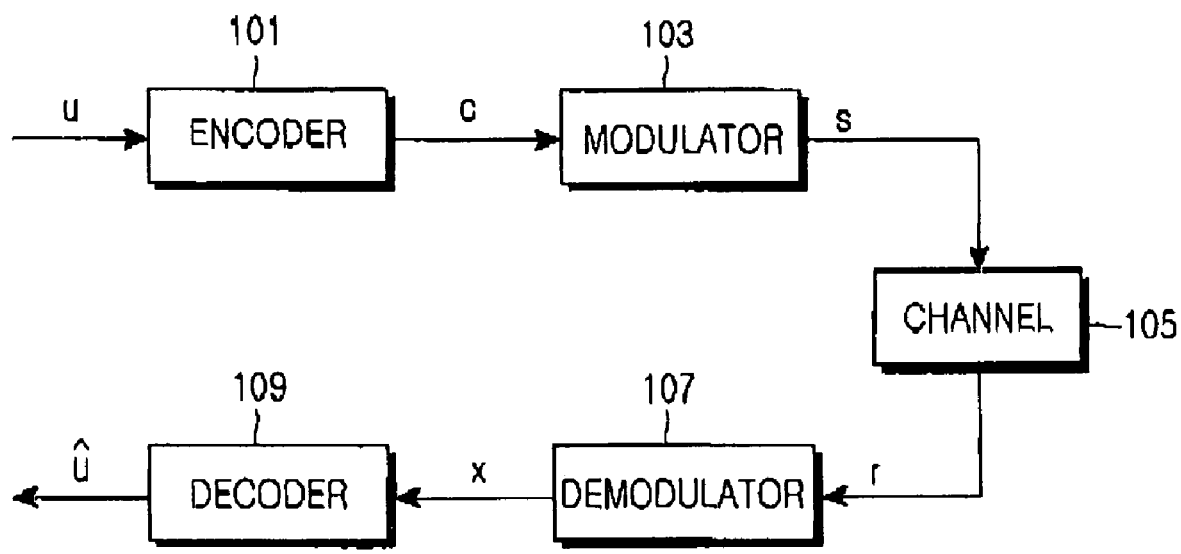
FIG. 1 is a block diagram schematically illustrating a transceiver of a conventional communication system.
FIG. 2 is a diagram illustrating a parity check matrix of a conventional (8, 2, 4) LDPC code.
Figure 3:
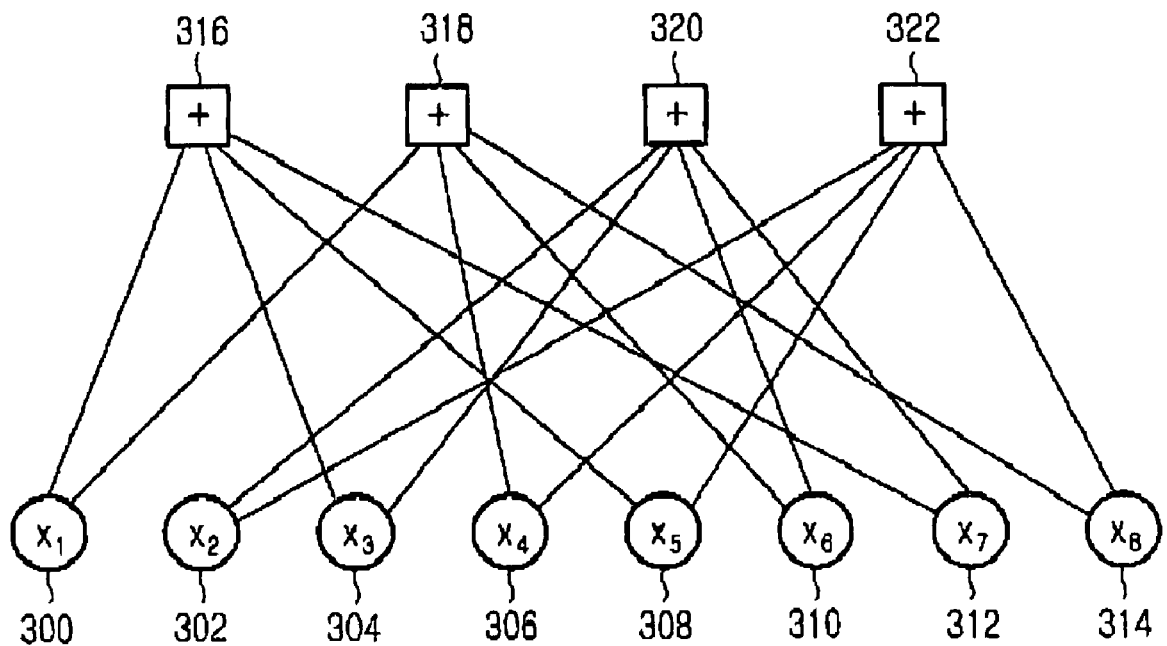
FIG. 3 is a diagram illustrating a factor graph of the (8, 2, 4) LDPC code illustrated in FIG. 2.
Figure 4:
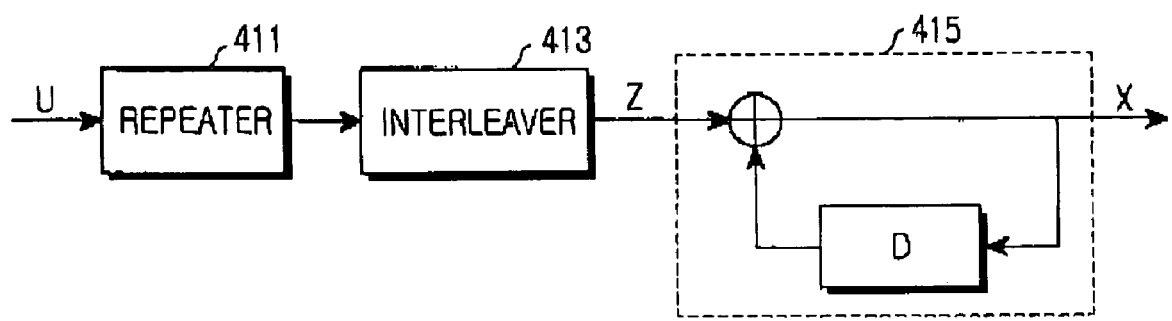
FIG. 4 is a block diagram schematically illustrating an encoder for a (qk,k) RA code.

FIG. 4 is a block diagram schematically illustrating an encoder for a (qk,k) RA code. Referring to FIG. 4, received length-K information data or information block $U=(u_1, \ldots, u_k)$ is input a repeater 411, which is an outer encoder. The repeater 411 repeats the information block $U=(u_1, \ldots, u_k)$ a predetermined number of times, e.g., q times, and outputs the results to an interleaver 413. The interleaver 413 interleaves a signal output from the repeater 411 according to a predetermined interleaving scheme, and outputs the interleaved signal to an accumulator 415, which is an inner encoder. Here, the interleaver 413 calculates a permutation function π, i.e., determines to which information bit of another component code it will map a specific information bit of one component code. Therefore, a signal output from the interleaver 413 becomes a sequence $Z=(z_1, \ldots, z_{qk})$ according to the permutation function.

The accumulator 415 receives the sequence $Z=(z_1, \ldots, z_{qk})$ output from the interleaver 413 and outputs a final codeword $X=(x_1, \ldots, x_{qk})$ according to a transfer function $$\frac{1}{1+D}.$$

Here, the accumulator 415 uses a coding rate of 1.

A structure of the encoder for an (qk,k) RA code has been described above with reference to FIG. 4, and next, a decoding process for the RA code will be described. However, before a description of a decoding process for the RA code is given, a description will be made of a two-way transfer scheme and a flooding transfer scheme, i.e., two typical message transfer schemes for calculating neighbor functions in a sum-product algorithm.

Two-Way Transfer Scheme

Each vertex in a transfer tree should have one of an inbound state and an outbound state, and an initial state of every vertex in the transfer tree is set to the inbound state. Calculation and a message transfer scheme performed at a vertex of each of the states will be described below.

(1) Inbound State

When a state of each of the vertexes is an inbound state, the two-way transfer scheme waits until messages are received from all but one of the edges. The one edge from which no message is received is called a "prime edge." The two-way transfer scheme performs neighbor calculation on variables not included by the prime edge by calculating the product of local functions for all received messages, and transmits the neighbor calculation results to the prime edge. The state of each of the vertexes for which the neighbor calculation results have been transmitted to the prime edge transitions to an outbound state.

(2) Outbound State

When a state of each of the vertexes is an outbound state, the two-way transfer scheme waits until a message is received from the prime edge. When a message is received from the prime edge, the two-way transfer scheme calculates the product of local functions for all messages except the message received from the prime edge for all edges other than the prime edge, performs neighbor calculation on variables not included by the prime edge, and transmits the neighbor calculation results to the prime edge. For a merged vertex, the two-way transfer scheme can calculate desired neighbor functions by calculating the product of local functions of all received messages and performing neighbor calculation on undesired variables.

For a leaf vertex, because the two-way transfer scheme is not required to wait in the inbound state, the message transmission starts from the leaf vertex. The message transmission makes progress from the leaf vertexes to the interior of a factor graph, and then proceeds back to the leaf vertexes, and when all leaf vertexes receive messages, the algorithm is terminated. Therefore, the two-way transfer scheme is suitable for serial implementation because messages are transmitted only once in each direction for each edge on the transfer tree.

Flooding Transfer Scheme (1) Initialization

Assuming that unit messages are received from a virtual edge, the flooding transfer scheme performs the following message flooding operation on respective vertexes.

(2) Message Flooding

When a message is received at a particular vertex from a particular edge, i.e., "edge e", the message will be referred to as a current message of the edge e, the particular edge e will be referred to as an incoming edge, and all the other edges will be referred to as outgoing edges e'. The flooding transfer scheme calculates the product of local functions of all current messages except a current message of e' for each outgoing edge e', performs neighbor calculation on all variables not included by e', and transmits the neighbor calculation results to e'. Here, a leaf vertex where there is no outgoing edge simply receives a transmitted message.

(3) Calculation of Neighbor Functions

When all edges have no more transmission messages, the algorithm is terminated, and the flooding transfer scheme calculates neighbor functions for respective merged vertexes using the same method as that of the two-way transfer scheme. Of course, the flooding transfer scheme can calculate current estimation values of neighbor functions even before the algorithm is terminated.

A basic principle of the flooding transfer scheme is that transmission of messages from one edge to a vertex triggers transmission of messages to all the other edges. Because the transfer tree has no cycle, all messages are absorbed into a leaf vertex. Because the flooding scheduling scheme is not required to wait before respective vertexes transmit messages, messages are transmitted at least once in one direction at one edge on the transfer tree. Therefore, the flooding transfer scheme is suitable for parallel implementation.

The decoding process for the RA code is performed using both of the two message transmission schemes. That is, in FIG. 4, the accumulator 415 transmits messages to the interleaver 413 using the two-way transfer scheme, and the repeater 411 transmits messages using the flooding transfer scheme.

Figure 5:
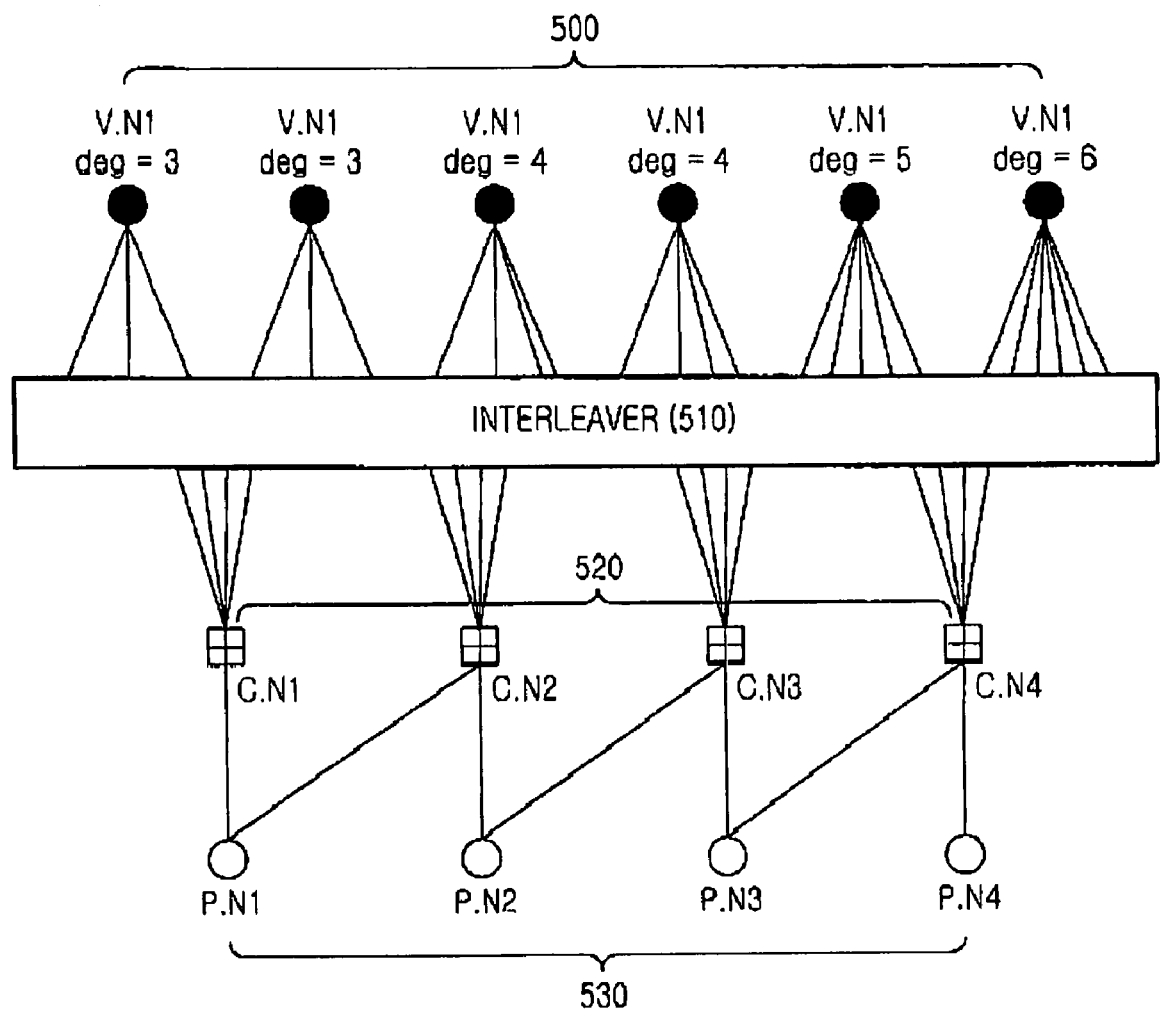
FIG. 5 is a diagram illustrating a factor graph of an irregular RA code.

FIG. 5 is a diagram illustrating a factor graph of an irregular RA code. The factor graph illustrated in FIG. 5 is a factor graph of an irregular RA code having parameters $(f_1, f_2, \ldots, f_j; a)$. Referring to FIG. 5, reference numeral 500 represents variable nodes corresponding to information bits of the irregular RA code, reference numeral 510 represents a permutation function $\pi$ representing a factor graph structure of the irregular RA code, reference numeral 520 represents check nodes of the irregular RA code, and reference numeral 530 represents variable node corresponding to parity bits of the irregular RA code.

In the parameters $(f_1, f_2, \ldots, f_j; a)$, $f_i \geq 0$ and $$\sum_i f_i = 1,$$

where $f_i$ denotes a ratio of degree=i variable nodes among the variable nodes 500 corresponding to information bits. The repeater 411 repeats information bits according to the $f_i$ and outputs the results to the interleaver 413. Further, in the parameters $(f_1, f_2, \ldots, f_j; a)$, 'a' is a positive integer and represents the average number of edges connected from the check nodes 520 to the variable nodes 500 corresponding to information bits. That is, the 'a' represents an average row weight of columns corresponding to an information part in a parity check matrix. Herein, the "weight" refers to the number of elements having a non-zero value, e.g., a value of 1, among the elements constituting the generating matrix and parity check matrix. Generally, row weights of columns corresponding to an information part of the parity check matrix should not be large in deviation in order to guarantee its excellent performance.

The permutation function 510, which represents a factor graph structure of the irregular RA code, is differently set according to how the irregular RA code is designed, and the permutation function 510 is very important because it determines a cycle structure of the irregular RA code. The variable nodes 530 corresponding to a parity part correspond to the accumulator 415.

FIG. 6 is a diagram illustrating a parity check matrix of an irregular RA code according to an embodiment of the present invention. However, before a description of FIG. 6 is given, it should be noted that an irregular RA code proposed in the present invention has simple structure, excellent performance, and low coding complexity by maintaining degree distribution of variable nodes calculated with a density evolution scheme.

Referring to FIG. 6, the parity check matrix of an irregular RA code is divided into a first information part 600, a second information part 602, and a parity part 604. The first information part 600 and the second information part 602 represent a part of the parity check matrix, which is corresponding to actual information bits in a process of coding the irregular RA code, and the parity part 604 represents a part of the parity check matrix, which is corresponding to actual parity bits.

The first information part 600 is comprised of 6 partial blocks, to each of which a permutation matrix is mapped. In FIG. 6, P represents an $N_s \times N_s$ permutation matrix, and a superscript $a_{ij}$ of the permutation matrix P satisfies a condition of $0 \leq a_{ij} \leq N_s - 1$. In addition, 'i' indicates that a corresponding permutation matrix is located in an $i^{th}$ row among a plurality of partial blocks constituting the parity check matrix, and 'j' indicates that a corresponding permutation matrix is located in a $j^{th}$ column among a plurality of partial blocks constituting the parity check matrix. That is, $P^{a_{ij}}$ represents a permutation matrix existing in a partial block located in a point where an $i^{th}$ row and a $j^{th}$ column of the parity check matrix comprised of a plurality of partial blocks cross each other. The permutation matrix P can be expressed as shown in Equation (1).

$$P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix} \quad (1)$$

In the permutation matrix, as shown by Equation (1), a weight of each of $N_s$ rows constituting the corresponding matrix is 1 and a weight of each of $N_s$ columns is also 1. In Equation (1), a permutation matrix whose superscript $a_{ij}$ is 0, i.e., a permutation matrix $P^0$, represents an identity matrix $I_{N_s \times N_s}$.

As a result, in each of 6 partial blocks constituting the first information part 600, a row weight of its column is 3 in total. That is, if a row weight of the column is defined as $N_w$, each of the 6 partial blocks included in the first information part 600 includes only the columns whose row weight is $N_3$.

The second information part 602 is comprised of 27 partial blocks, to each of which a permutation matrix is mapped. A superscript $b_{ij}$ of the permutation matrix P satisfies a condition of $0 \leq b_{ij} \leq N_s - 1$. As a result, in each of 27 partial blocks constituting the second information part 602, a row weight of its column is 9 in total. That is, each of the 27 partial blocks constituting the second information part 602 is comprised of only the columns whose row weight is $N_9$.

The parity part 604 is comprised of a dual diagonal matrix. As a result, in the dual diagonal matrix constituting the parity part 604, a row weight of its column is 2 in total. That is, the dual diagonal matrix included in the parity part 604 is comprised of only the columns whose row weight is $N_2$. In conclusion, the dual diagonal matrix of the parity part 604 determines RA code characteristics of the accumulator 415.

It is known that the use of density evolution guarantees excellent performance when respective columns of a parity check matrix with a coding rate of ½, of which row weights are 2, 3, and 9, are in the ratio of 2:1:3. As described in connection with FIG. 6, in a parity check matrix of an irregular RA code proposed in the present invention, respective columns whose row weights are 2, 3, and 9 are in the ratio of 2:1:3, guaranteeing its excellent performance. In addition, it is possible to simply control row weights of the respective columns in the parity check matrix of the irregular RA code by forming the first information part 600 and the second information part 602 with permutation matrixes as described in conjunction with FIG. 6.

In designing codes belonging to the LDPC code, although it is important to match a row weight of a column calculated by density evolution to a ratio of the corresponding column, it is also important to control a cycle structure on the factor graph. That is, because the cycle structure on the factor graph greatly affects performance of the codes belonging to the LDPC code, the cycle structure should also be considered in designing the irregular RA code.

It will be assumed that in the parity check matrix described in connection with FIG. 6, the first information part 600 is comprised of 6×6 unit matrixes (or identity matrixes) and the second information part 602 is comprised of 2×2 unit matrixes. As described above, the interleaver 413 can be defined as a permutation function indicating to which check node, i.e., to which parity check formula, it corresponds, after information bits input to an encoder are repeated as many times as a row weight of each column of a parity check matrix. Therefore, in order to design the interleaver 413, it is necessary to sequentially search an information part of the parity check matrix for a row where an element having a non-zero value, e.g., a value of 1, is located beginning from its first column. On this assumption, the interleaver 413 can be defined as shown in the following permutation function.

(1,31,61,6,36,66,11,41,71,16,46,76,21,51,81,26,56,86, 2,32,62,7,37,67,12,42,72,17,47,77,22,52,82,27,57,87, 3,13, 23,33,43,53,63,73,83,8,18,28,38,48,58,68,78,88, 4,14,24,34,44,54,64,74,84,9,19,29,39,49,59,69,79,89, 5,15, 25,35,45,55,65,75,85,10,20,30,40,50,60,70,80,90)

In the permutation function, a comparison between a first row and a second row shows that corresponding values increase by one, and comparisons between a third row, a fourth row and a fifth row also have the same characteristics because it is assumed that unit matrixes are inserted into the first information part 600 and the second information part 602. By defining a parity check matrix for an irregular RA code in the foregoing manner, an interleaver for coding the irregular RA code can be made.

Figure 7:
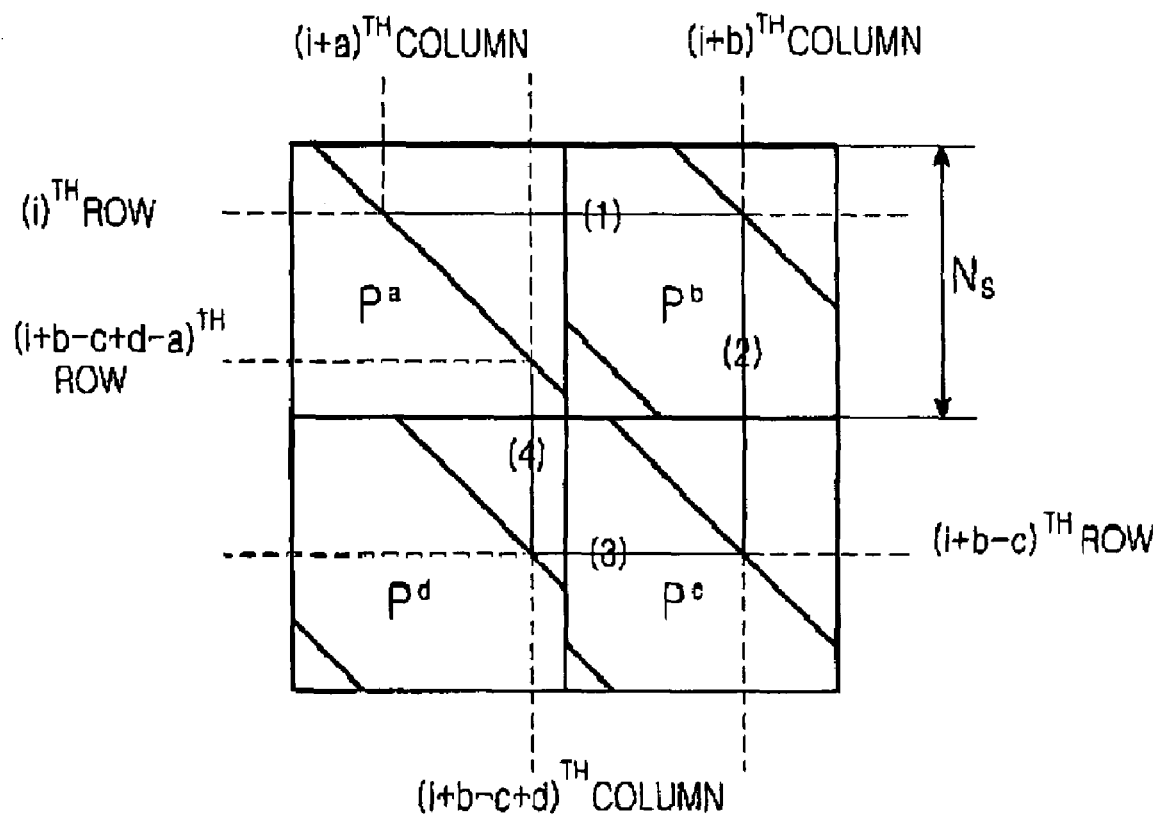
FIG. 7 is a diagram schematically illustrating a cycle structure of an irregular RA code whose parity check matrix includes 4 permutation matrixes.

FIG. 7 is a diagram schematically illustrating a cycle structure of an irregular RA code whose parity check matrix includes 4 permutation matrixes. A parity check matrix of the irregular RA code illustrated in FIG. 7 is comprised of 4 blocks, diagonals illustrated in FIG. 7 represent position where elements having a non-zero value, e.g., a value of 1, are located, and other parts except the diagonals represent positions where elements having a value of 0 are located. In addition, P represents the permutation matrix.

In order to analyze a cycle structure of the irregular RA code illustrated in FIG. 7, an element having a value of 1, located in an $i^{th}$ row of a partial matrix $P^a$, is defined as a reference element, and the element having a value of 1 located in the $i^{th}$ row will be referred to as a "0-point." Here, the "partial matrix" refers to a matrix corresponding to the partial block. The 0-point is located in an $(i+a)^{th}$ column of the partial matrix $P^a$.

An element having a value of 1 in a partial matrix $p^b$, located in the same row as the 0-point, will be referred to as a "1-point." For the same reason as the 0-point, the 1-point is located in an $(i+b)^{th}$ column of the partial matrix $P^b$.

Next, an element having a value of 1 in a partial matrix $p^c$, located in the same column as the 1-point, will be referred to as a "2-point." Because the partial matrix $P^c$ is a matrix acquired by shifting respective columns of a unit matrix I to the right with respect to a modulo $N_s$ by c, the 2-point is located in an $(i+b-c)^{th}$ row of the partial matrix $P^c$.

In addition, an element having a value of 1 in a partial matrix $P^d$, located in the same row as the 2-point, will be referred to as a "3-point." The 3-point is located in an $(i+b-c+d)^{th}$ column of the partial matrix $P^d$.

Finally, an element having a value of 1 in the partial matrix $P^a$, located in the same column as the 3-point, will be referred to as a "4-point." The 4-point is located in an $(i+b-c+d-a)^{th}$ row of the partial matrix $P^a$.

In the cycle structure of the irregular RA code illustrated in FIG. 7, if a cycle with a length 4 exists, the 0-point and the 4-point are located in the same position. That is, a relation between the 0-point and the 4-point is defined as shown in Equation (2).

$$i \equiv i+b-c+d-a \pmod{N_s} \text{ or } i+a \equiv i+b-c+d \pmod{N_s} \qquad (2)$$

Equation (2) can be rewritten as Equation (3).

$$a+c \equiv b+d \pmod{N_s} \qquad (3)$$

As a result, when the relation of Equation (3) is satisfied, a cycle with a length 4 is generated. Generally, when a 0-point and a 4 m-point are first identical to each other, a relation of $i \equiv i+m(b-c+d-a) \pmod{N_s}$ is given, and the following relation shown in Equation (4) is satisfied.

$$m(a-b+c-d) \equiv 0 \pmod{N_s} \qquad (4)$$

That is, if a positive integer having a minimum value among positive integers satisfying Equation (4) for given a, b, c and d is defined as 'm', a cycle with a length 4 m becomes a cycle having a minimum length in the cycle structure of the irregular RA code illustrated in FIG. 7.

Therefore, as described above, for $(a-b+c-d) \neq 0$, if gcd $(N_s, a-b+c-d)=1$ is satisfied, then $m=N_s$. Therefore, a cycle with a length $4 N_s$ becomes a cycle with a minimum length.

For the irregular RA code described above, the following rules can be induced.

Rule 1

If a cycle with a length 2 l exists in the irregular RA code, a condition of Equation (5) should be satisfied.

$$a_1+a_3+a_5+\ldots+a_{2l-1} \equiv a_2+a_4+a_6+\ldots+a_{2l} \pmod{N_s} \qquad (5)$$

In Equation (5), $a_i$ (i=1, 2, ..., 2 l) represents exponents of permutation matrixes through which a cycle with a length 2 l sequentially passes. That is, this indicates that a cycle with a length 21passes through partial blocks included in the parity check matrix of the irregular RA code in order of $P^{a_1} \to P^{a_2} \to \ldots \to P^{a_{21}}$. Here, not all of the $a_i$ values should necessarily be different from each other, and the corresponding cycle may repeatedly pass through some partial blocks.

Rule 2

'm' will be defined as a minimum positive integer satisfying Equation (6).

$$m\left(\sum_{i:odd} a_i - \sum_{j:even} a_j\right) \equiv 0(\bmod N_s), \quad (1 \le i, j \le 2l) \qquad (6)$$

In Equation (6), $a_i$ represents exponents of permutation matrixes appropriately selected such that a block-based cycle should be formed in the entire parity check matrix. As described in Rule 1, not all of the $a_i$ values should necessarily be different from each other, and the corresponding cycle may repeatedly pass through some partial blocks. As a result, partial matrixes $P^{a_i}$ have a cycle structure in which a minimum length is 21 m.

A characteristic of the cycle structure of the irregular RA code can be easily analyzed using Rule 1 and Rule 2. For example, with the use of Rule 1 and Rule 2, it is possible not only to correctly determine how many cycles with a minimum length of 6 are distributed in an array code, but also to simply analyze a characteristic of a structure of a block-based cycle (hereinafter referred to as "block cycle") of the irregular RA code, which will be described herein below. Here, the block cycle is an important factor used for adjusting a cycle length in forming a parity check matrix, and the block cycle will be described with reference to FIG. 8, Rule 1, and Rule 2.

Figure 8:
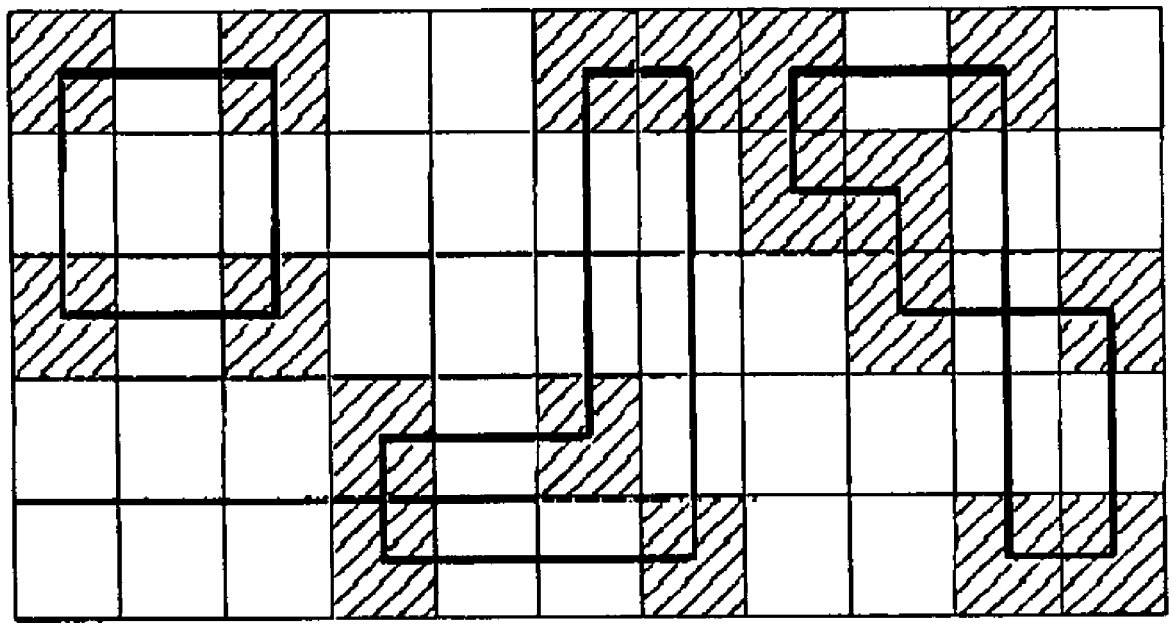
FIG. 8 is a diagram schematically illustrating a block cycle structure of an irregular RA code.

FIG. 8 is a diagram schematically illustrating a block cycle structure of an irregular RA code. Referring to FIG. 8, each of blocks included in the irregular RA code is assumed to have a weight 1, and when the blocks form a cycle, it is said that "a block cycle is formed." FIG. 8 illustrates, from the left, a block cycle formed with 4 blocks, a block cycle formed with 6 blocks, and a block cycle formed with 8 blocks.

As described in Rule 1 and Rule 2, although a block cycle with a short length shown in FIG. 8 is formed, if partial matrixes corresponding to blocks constituting the block cycle are appropriately selected, it is possible to perform a control operation such that a cycle with a short length should not be generated in an actual parity check matrix. However, when a plurality of block cycles overlap each other in the irregular RA code, a minimum length of actual cycles in the block cycles is reduce. As a result, cycles with a short length are undesirably generated in the actual parity check matrix.

Figure 9:
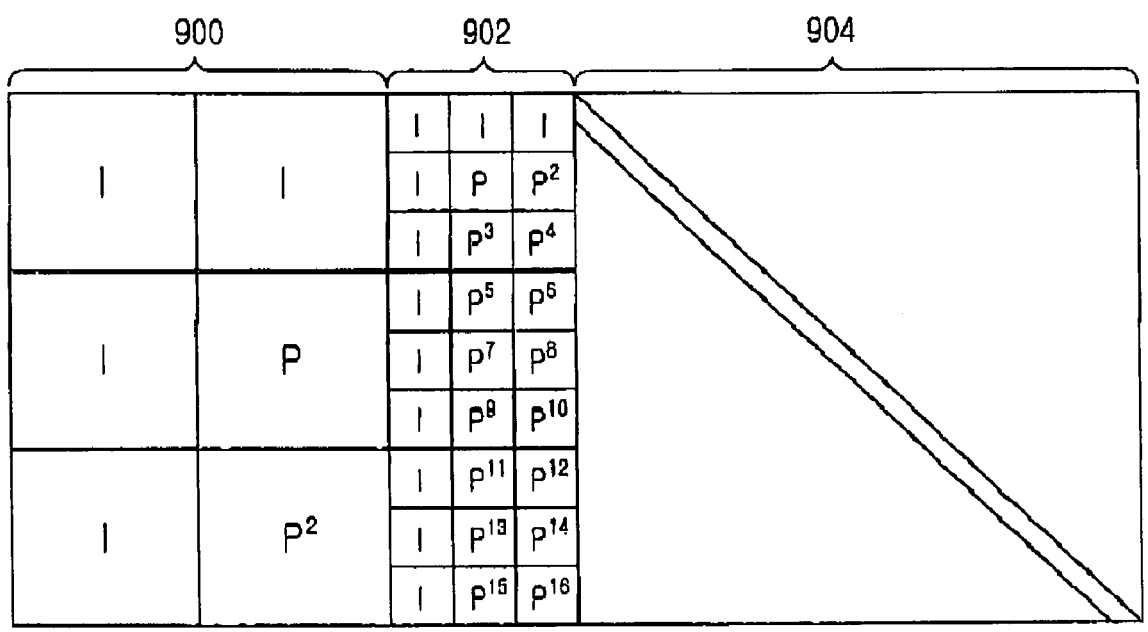
FIG. 9 is a diagram illustrating an example of a parity check matrix of an irregular RA code according to an embodiment of the present invention.

FIG. 9 is a diagram illustrating an example of a parity check matrix of an irregular RA code according to an embodiment of the present invention. Referring to FIG. 9, in the parity check matrix of the irregular RA code, a cycle between variable node parts with a low degree, i.e., a degree=2 node and a degree=3 node corresponding to a first information part 900 and a parity part 904, becomes 8 in its minimum length. Because a second information part 902 corresponding to a variable node part with a high degree is less susceptible to a size of the cycle, i.e., because a node with a high degree, although its cycle is somewhat short, does not greatly affect performance, a cycle between the second information part 902 and the first information part 900 is not considered. Also, a cycle between the second information part 902 and the parity part 904 has a minimum value of 8.

Figure 10:
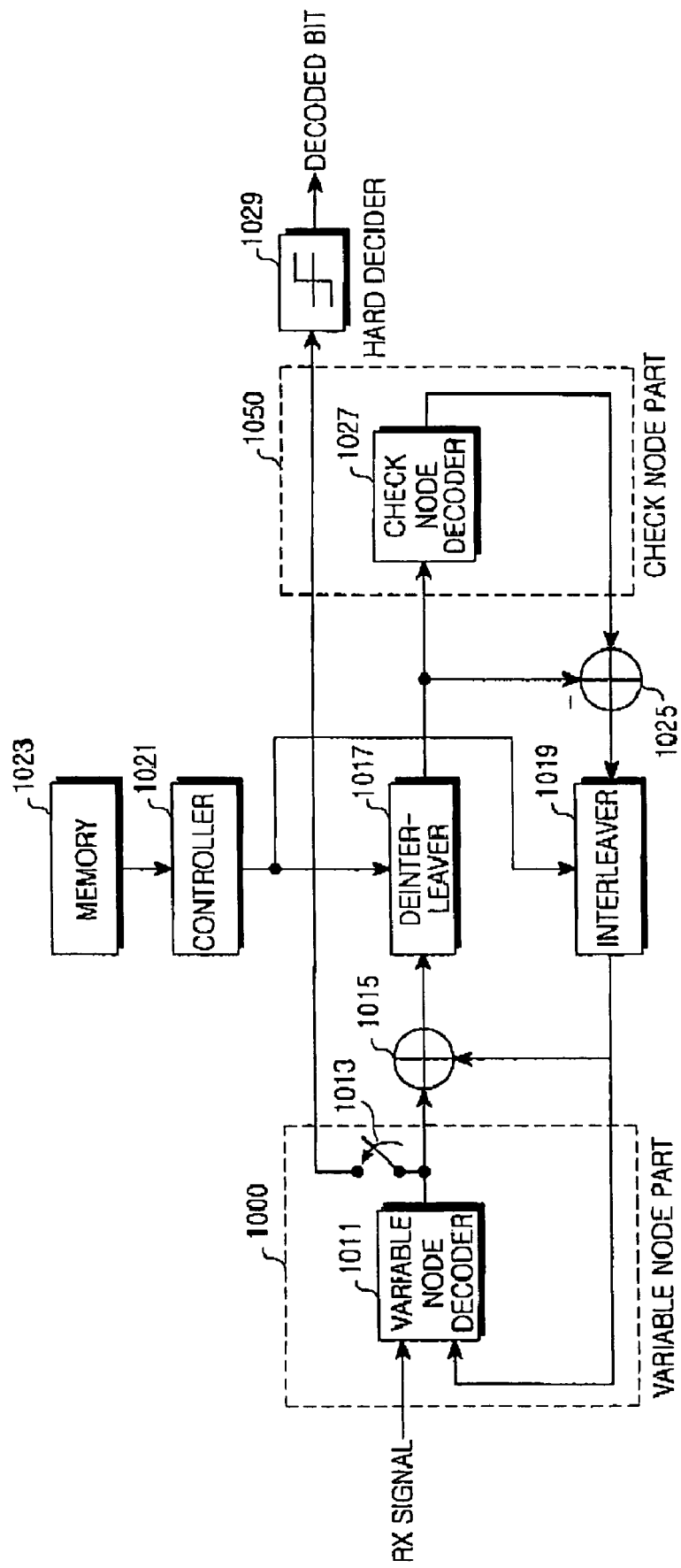
FIG. 10 is a diagram illustrating an internal structure of a decoding apparatus for decoding an irregular RA code according to an embodiment of the present invention.

FIG. 10 is a diagram illustrating an internal structure of a decoding apparatus for decoding an irregular RA code according to an embodiment of the present invention. Referring to FIG. 10, the decoding apparatus for decoding an irregular RA code includes a variable node part 1000, an adder 1015, a deinterleaver 1017, an interleaver 1019, a controller 1021, a memory 1023, an adder 1025, a check node part 1050, and a hard decider 1029. The variable node part 1000 includes a variable node decoder 1011 and a switch 1013, and the check node part 1050 includes a check node decoder 1027.

A signal received over a wireless channel is input to the variable node decoder 1011, and the variable node decoder 1011 calculates probability values of the received signal, updates the calculated probability values, and outputs the updated probability values to the switch 1013 and the adder 1105. Here, the variable node decoder 1011 connects variable nodes according to a parity check matrix previously set in the decoding apparatus for an irregular RA code, and performs an update calculation on as many input values and output values as the number of 1 s connected to the variable nodes. The number of 1 s connected to the variable nodes is equal to a weight of each of columns included in the parity check matrix. Therefore, interval calculation of the variable node decoder 1011 is different according to a weight of each of the columns constituting the parity check matrix.

The adder 1015 receives a signal output from the variable node decoder 1011 and an output signal of the interleaver 1019 in a previous iterative decoding process, subtracts the output signal of the interleaver 1019 in the previous iterative decoding process from the output signal of the variable node decoder 1011, and outputs the subtraction result to the deinterleaver 1017. Here, if the decoding process is an initial decoding process, it should be regarded that the output signal of the interleaver 1019 is 0.

The deinterleaver 1017 deinterleaves the signal output from the adder 1015 according to a predetermined interleaving scheme, and outputs the deinterleaved signal to the adder 1025 and the check node decoder 1027. The deinterleaver 1017 has an interval structure corresponding to the parity check matrix because an output value for an input value of the interleaver 1019 corresponding to the deinterleaver 1017 is different according to a position of elements having a value of 1 in the parity check matrix.

The adder 1025 receives an output signal of the check node decoder 1027 in a previous iterative decoding process and an output signal of the deinterleaver 1017, subtracts the output signal of the deinterleaver 1017 from the output signal of the check node decoder 1027 in the previous iterative decoding process, and outputs the subtraction result to the interleaver 1019. The check node decoder 1027 connects check nodes according to a parity check matrix previously set in the decoding apparatus for an irregular RA code, and performs update calculation on as many input values and output values as the number of 1s connected to the check nodes. The number of 1s connected to the check nodes is equal to a weight of each of rows constituting the parity check matrix. Therefore, interval calculation of the check node decoder 1027 is different according to a weight of each of the rows constituting the parity check matrix.

The interleaver 1019, under the control of the controller 1021, interleaves the signal output from the adder 1025 according to a predetermined interleaving scheme, and outputs the interleaved signal to the adder 1015 and the variable node decoder 1011. The controller 1021 reads interleaving scheme-related information previously stored in the memory 1023, and controls an interleaving scheme of the interleaver 1019 according to the read interleaving scheme information. Likewise, if the decoding process is an initial decoding process, it should be regarded that the output signal of the deinterleaver 1017 is 0.

By iteratively performing the foregoing processes, the decoding apparatus performs error-free reliable decoding. After the iterative decoding is performed a predetermined number of times, the switch 1013 switches off a connection between the variable node decoder 1011 and the adder 1015, and switches on a connection between the variable node decoder 1011 and the hard decider 1029 to provide the signal output from the variable node decoder 1011 to the hard decider 1029. The hard decider 1029 makes a hard decision on the signal output from the variable node decoder 1011, and outputs the hard decision result, and the output value of the hard decider 1029 becomes a finally decoded value.

As can be understood from the foregoing description, the present invention proposes an irregular RA code that can undergo real-time coding and decoding to maximize error correcting capability, thereby improving system performance. In addition, the present invention generates an efficient parity check matrix for the irregular RA code, thereby minimizing complexity of the irregular RA code.

While the present invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for generating a parity check matrix of an irregular Repeat Accumulate (RA) code, comprising the steps of:
   (a) determining a size of the parity check matrix of the irregular RA code such that the size corresponds to a coding rate and a codeword length, both of which are applied when coding an information word with the irregular RA code;
   (b) dividing the parity check matrix with the determined size into a first information part and a second information part, both of which correspond to the information word, and a parity part corresponding to a parity;
   (c) arranging permutation matrixes in the first information part and the second information part such that a minimum length of a cycle on a factor graph of the irregular RA code becomes a predetermined length and weights are irregular; and
   (d) generating the parity check matrix by arranging a dual diagonal matrix in the parity part.

2. The method of claim 1, wherein the step (c) comprises the steps of:
   dividing the first information part into L blocks;
   dividing the second information part into M blocks; and
   arranging permutation matrixes in the L blocks and the M blocks such that a minimum length of a cycle on the factor graph of the irregular RA code becomes a predetermined length.

3. The method of claim 2, wherein L=6 and M=27.

4. A method for coding an irregular Repeat Accumulate (RA) code, comprising the steps of:
   receiving an information word;
   repeating the information word such that the information word corresponds to weights of a first information part and a second information part of a parity check matrix in which permutation matrixes are arranged in the first information part and the second information part corresponding to the information word such that a minimum length of a cycle on a factor graph of the irregular RA code becomes a predetermined length and weights are irregular, and a dual diagonal matrix is arranged in a parity part corresponding to a parity;
   interleaving the repeated signal using an interleaving scheme predefined for the parity check matrix; and
   generating the irregular RA code by accumulating the interleaved signal according to a weight of the parity part.

5. The method of claim 4, wherein the interleaving scheme is a permutation function corresponding to a factor graph of the parity check matrix.

6. The method of claim 4, wherein the parity check matrix is generated by dividing the first information part into L blocks, dividing the second information part into M blocks, and arranging permutation matrixes in the L blocks and the M blocks such that a minimum length of a cycle on a factor graph of the irregular RA code becomes a predetermined length.

7. The method of claim 6, wherein L=6 and M=27.

8. An apparatus for coding an irregular Repeat Accumulate (RA) code, comprising:
   a repeater for receiving an information word, repeating the information word such that the information word corresponds to weights of a first information part and a second information part of a parity check matrix in which permutation matrixes are arranged in the first information part and the second information part corresponding to the information word such that a minimum length of a cycle on a factor graph of the irregular RA code becomes a predetermined length and weights are irregular, and a dual diagonal matrix is arranged in a parity part corresponding to a parity;
   an interleaver for interleaving a signal output from the repeater using an interleaving scheme predefined for the parity check matrix; and
   an accumulator for generating the irregular RA code by accumulating a signal output from the interleaver according to a weight of the parity part.

9. The apparatus of claim 8, wherein the interleaving scheme is a permutation function corresponding to a factor graph of the parity check matrix.

10. The apparatus of claim 8, wherein the parity check matrix is generated by dividing the first information part into L blocks, dividing the second information part into M blocks, and arranging permutation matrixes in the L blocks and the M blocks such that a minimum length of a cycle on a factor graph of the irregular RA code becomes a predetermined length.

11. The apparatus of claim 10, wherein L=6 and M=27.

12. A method for decoding an irregular Repeat Accumulate (RA) code, comprising the steps of:
   generating a parity check matrix in which permutation matrixes are arranged in a first information part and a second information part corresponding to an information word such that a minimum length of a cycle on a factor graph of the irregular RA code becomes a predetermined length and weights are irregular, and a dual diagonal matrix is arranged in a parity part corresponding to a parity;
   determining a deinterleaving scheme and an interleaving scheme for the parity check matrix;
   detecting probability values of a received signal;

generating a first signal by subtracting a signal generated in a previous decoding process from the probability values of the received signal;

deinterleaving the first signal using the deinterleaving scheme;

detecting probability values from the deinterleaved signal;

generating a second signal by subtracting the deinterleaved signal from the probability values of the deinterleaved signal;

interleaving the second signal using the interleaving scheme; and iterative-decoding the interleaved signal.

13. The method of claim 12, wherein the parity check matrix is generated by dividing the first information part into L blocks, dividing the second information part into M blocks, and arranging permutation matrixes in the L blocks and the M blocks such that a minimum length of a cycle on a factor graph of the irregular RA code becomes a predetermined length.

14. The method of claim 13, wherein L=6 and M=27.

15. An apparatus for decoding an irregular Repeat Accumulate (RA) code, comprising:

a variable node decoder for detecting probability values of a received signal by connecting variable nodes according to a weight of each of columns included in a parity check matrix in which permutation matrixes are arranged in a first information part and a second information part corresponding to an information word such that a minimum length of a cycle on a factor graph of the irregular RA code becomes a predetermined length and weights are irregular, and a dual diagonal matrix is arranged in a parity part corresponding to a parity;

a first adder for subtracting a signal generated in a previous decoding process from an output signal of the variable node decoder;

a deinterleaver for deinterleaving an output signal of the first adder using a deinterleaving scheme predefined for the parity check matrix;

a check node decoder for detecting probability values of an output signal of the deinterleaver by connecting check nodes according to a weight of each of rows constituting the parity check matrix;

a second adder for subtracting an output signal of the deinterleaver from an output signal of the check node decoder;

an interleaver for interleaving an output signal of the second adder using an interleaving scheme predefined for the parity check matrix, and outputting the interleaved signal to the variable node decoder and the first adder; and a controller for generating the parity check matrix, and controlling the deinterleaving scheme and the interleaving scheme according to the parity check matrix.

16. The apparatus of claim 15, wherein the controller generates the parity check matrix by dividing the first information part into L blocks, dividing the second information part into M blocks, and arranging permutation matrixes in the L blocks and the M blocks such that a minimum length of a cycle on a factor graph of the irregular RA code becomes a predetermined length.

17. The apparatus of claim 15, wherein L=6 and M=27.

* * * * *